(12) United States Patent
Liu

(10) Patent No.: US 7,366,483 B2
(45) Date of Patent: Apr. 29, 2008

(54) SYSTEM AND METHOD FOR RF POWER CONTROL

(75) Inventor: I-Ru Liu, Taipei (TW)

(73) Assignee: Accton Technology Corporation, Hsinchu (TW)

( * ) Notice: Subject to any disclaimer, the term of this patent is extended or adjusted under 35 U.S.C. 154(b) by 600 days.

(21) Appl. No.: 10/739,322

(22) Filed: Dec. 19, 2003

(65) Prior Publication Data

US 2005/0136869 A1 Jun. 23, 2005

(51) Int. Cl.
*H01Q 11/12* (2006.01)
(52) U.S. Cl. .................. 455/127.1; 455/522
(58) Field of Classification Search ........... 455/245.1, 455/232.1, 234.2, 239.1, 127.1, 2, 115.3, 455/102, 114.2, 273, 522; 330/297, 278, 330/273, 285
See application file for complete search history.

(56) References Cited

U.S. PATENT DOCUMENTS

| | | | | |
|---|---|---|---|---|
| 6,163,706 A | * | 12/2000 | Rozenblit et al. | ........... 455/522 |
| 2003/0114127 A1 | * | 6/2003 | Baldwin | .................. 455/245.1 |
| 2003/0194979 A1 | * | 10/2003 | Richards et al. | ........... 455/216 |

* cited by examiner

*Primary Examiner*—Tu Nguyen
(74) *Attorney, Agent, or Firm*—Birch, Stewart, Kolasch & Birch, LLP

(57) ABSTRACT

The present invention provides a system and method for radio frequency (RF) power control that can adjust and transmit the RF power to the transmitting device according to the data rate under which the RF signal is going to transmit.

7 Claims, 4 Drawing Sheets

SYSTEM AND METHOD FOR RF POWER CONTROL

BACKGROUND OF THE INVENTION (a). Field of the Invention

The present invention relates in general to radio frequency (RF) power control, and more particularly to a system and method that adjusts the power supply according to a data rate for transmitting RF signals in good quality.

(b). Description of the Prior Arts

In the Internet era, people tend to consume a lot of information rapidly. And along with the progress of wireless communication technology, people also want to be freed from the limit of wire connections. Wireless local area network (WLAN), combing the network and wireless communication technologies, is then an ideal solution for these needs.

However, in current WLAN applications, a fixed power supply or a fixed bias source is used for RF power amplification. To achieve the goal of real-time communication, a high data rate is needed. However, the transmitting power cannot be retained in a fixed level while the data rate is increasing. When the data rate increases, the transmitting power is lowered, and thus the transmission distance is shortened and in most cases the transmission quality is lowered as well. This is because the average power and peak-to-average power ratio, in the case of the high data rate, are both increased, and the output current and voltage of the power supply need to be upgraded to meet the increased average power and peak-to-average power ratio respectively. Therefore, the fixed power supply or the fixed bias source would cause the power inadequacy of transmitters of the current WLAN applications.

These transmitters commonly employ a power-amplifying unit to amplify RF signals to be transmitted. FIG. 1 is a diagram showing a typical output power-to-input power curve of the power-amplifying unit. The horizontal axis of FIG. 1 is the RF input power while the vertical axis of FIG. 1 is the corresponding RF output power. As shown in FIG. 1, the curve can be divided into a linear region and a saturation region. In the linear region, the output power is varied in direct proportion to the variation of the input power. However, for the same increase of the input power, the increase of the output power in the saturation region is lower than that in the linear region. More critically, the data error rate in the saturation region is higher than that in the linear region. Thus, it is desirable to extend the operating range of the linear region as large as possible and to avoid operating in the saturation region.

When a high data rate is required and a fixed power supply is adopted, the RF input power may be increased to upgrade the RF output power, thereby avoiding the power inadequacy mentioned above. Although the increase of the RF input power could extend the transmission distance, the power-amplifying unit may operate in the saturation region, result in a higher data error rate and thus lower the signal quality. On the other hand, the RF input power or the gain of the power-amplifying unit may be decreased to preserve the signal quality, nevertheless, the output power cannot be reinforced if the provided power is fixed. Besides, the RF output power is conventionally adjusted according to the transmitting signal strength rather than the data rate.

Moreover, if a fixed high power supply is employed, then it will bring power waste when the data rate is low. Many WLAN applications use batteries for power provision, and the power waste would lower the battery duration and then impact the performance of these applications.

In sum, the drawbacks of using a fixed power supply or a fixed bias source for power amplification of RF signal transmission include: (1) the lowered transmitting power and shortened transmission distance, or the lowered data rate and decreased throughput; (2) the degraded signal quality while preserving the transmitting power; and (3) the power waste when the data rate is low.

SUMMARY OF THE INVENTION

An object of the present invention is to provide a system and method for RF power control, which can adjust the power supply therein according to data rates for transmitting RF signals in good quality.

Another object of the present invention is to provide a system and method for RF power control, which can avoid possible signal quality degradation resulted from RF power amplification.

Another object of the present invention is to provide a system and method for RF power control, which can bring an electricity-saving effect to a transmitting device therein.

Accordingly, in attainment of the aforementioned objects, it is a feature of the present invention to provide a system for RF power control. The system includes: a control unit for generating a control signal according to a data rate; a transmitting unit for transmitting a RF signal; and a power supply unit, coupled to the control unit, for providing power to the transmitting unit according to the control signal.

It is another feature of the present invention to provide a method for RF power control. The method includes: selecting a data rate; generating a control signal according to the data rate; adjusting and providing power according to the control signal; and transmitting a RF signal in response to the power.

DETAILED DESCRIPTION OF THE PRESENT INVENTION

The present invention can provide a flexible power scheme by adjusting the power supply for RF power amplification according to the data rate. A detailed description of the present invention is provided below with preferred embodiments and appended drawings.

Figure 1:
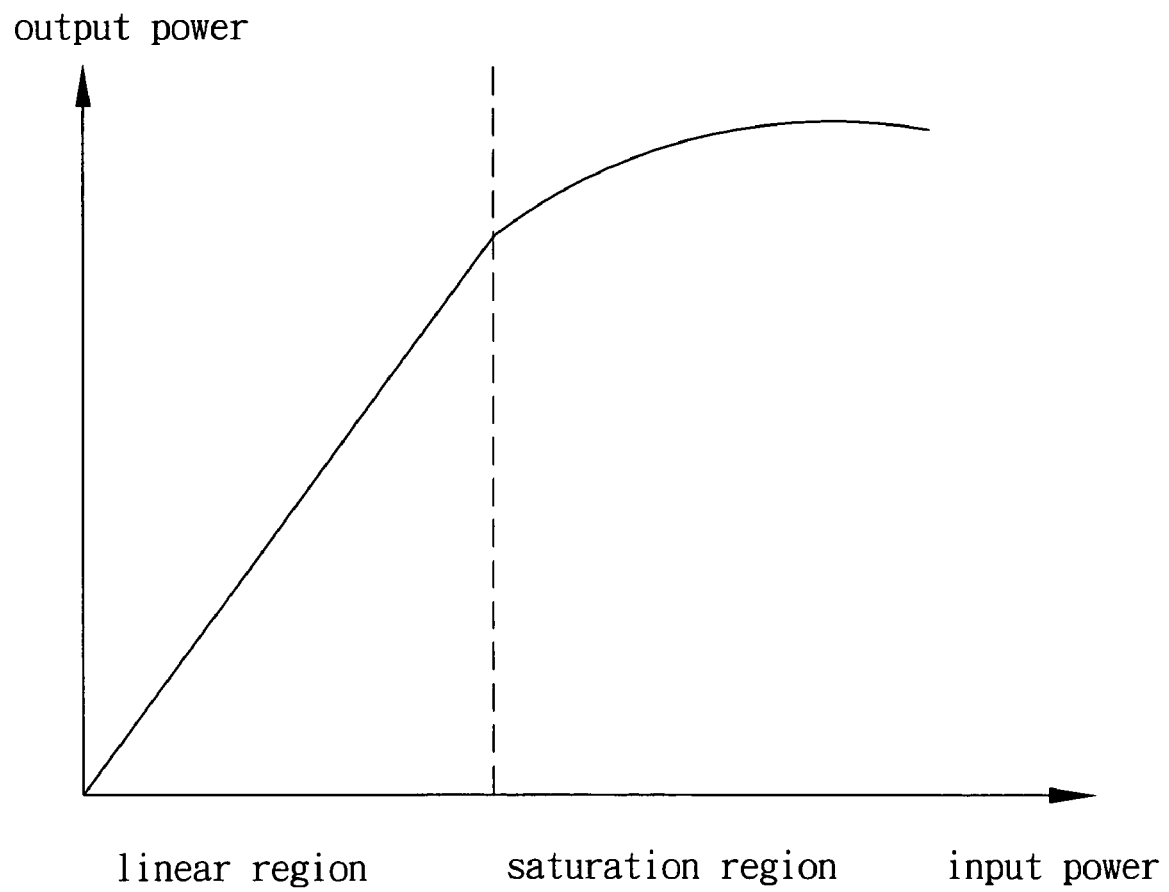
FIG. 1 is a diagram showing a typical output power-to-input power curve of the power-amplifying unit.
Figure 2:
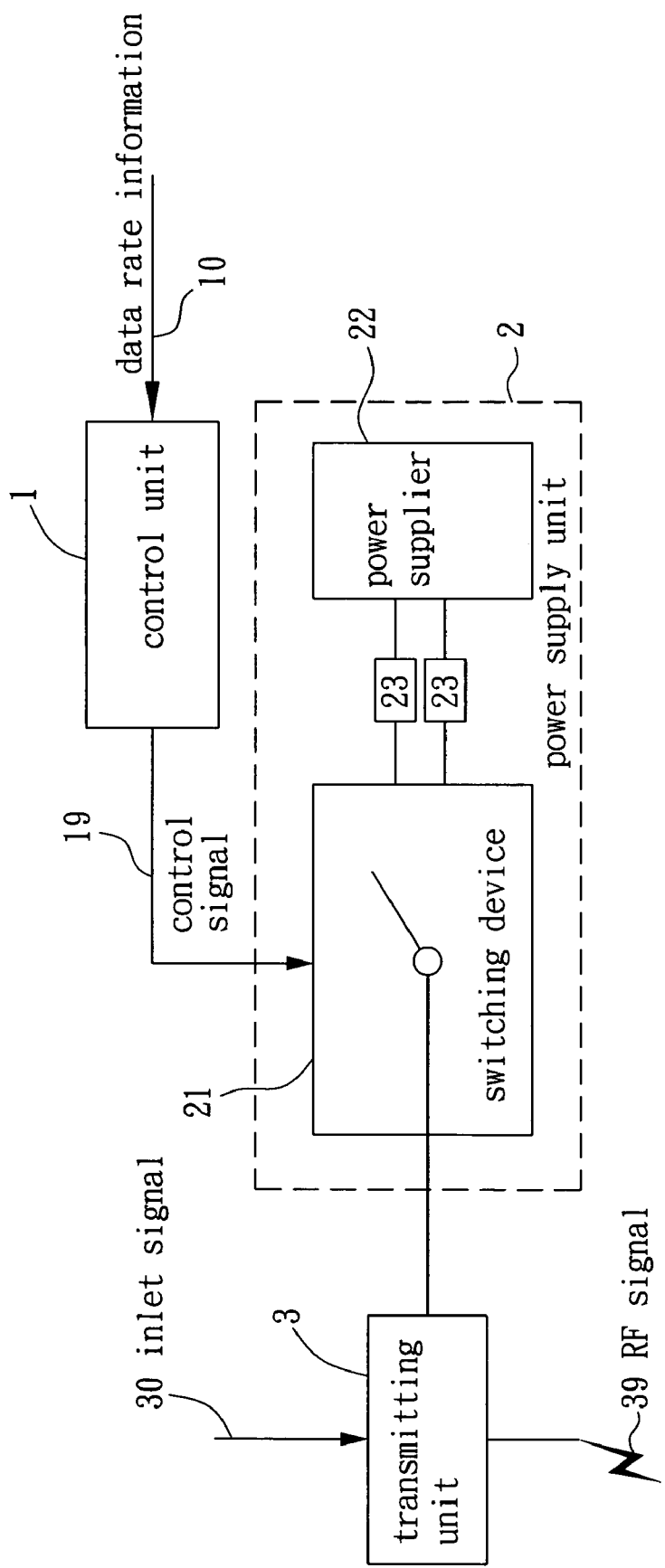
FIG. 2 is a block diagram showing a preferred embodiment of the system for RF power control according to the present invention.

FIG. 2 is a block diagram showing a preferred embodiment of the system for RF power control according to the present invention. As shown in FIG. 2, the system includes a control unit 1, a power supply unit 2 and a transmitting unit 3. The control unit 1 generates a control signal 19 according to data rate information 10. The data rate information 10 can be a data rate or any signal presenting the data rate. The control unit 1 may include a processor (not shown) to assign the data rate information 10 to a group in terms of a rate range, such as 0-20 Mbps, 20-40 Mbps, 40-60 Mbps, etc. The processor then outputs the control signal 19 containing information, such as a data rate indicator or an index, for indicating the assigned group of the data rate information 10. The different groups of the data rates can be pre-installed in a storage device (not shown) and/or flexibly modified during the system operation.

The power supply unit 2, coupled to the control unit 1, is for adjusting and providing power to the transmitting unit 3 according to the control signal 19, especially according to the information for indicating the assigned group of the data rate information 10, such as the data rate indicator. The power supply unit 2 employs a switching device 21 for switching between different power levels according to the control signal 19. The number of the power levels may be equal to the number of the groups of different rate ranges. In the embodiment of FIG. 2, the power supply unit 2 provides at least a high power level (with high voltage/current level) corresponding to a high data rate, and a low power level (with low voltage/current level) corresponding to a low data rate. The power supply unit 2 can be implemented by a power supplier 22 and two voltage/current level shifters 23 switched by the switching device 21, as shown in FIG. 2.

The transmitting unit 3 is adaptable for RF signal transmitting. The transmitting unit 3 can receive an inlet RF signal 30 and transmit a RF signal 39 according to the power provided by the power supply unit 2, as shown in FIG. 2.

Figure 3:
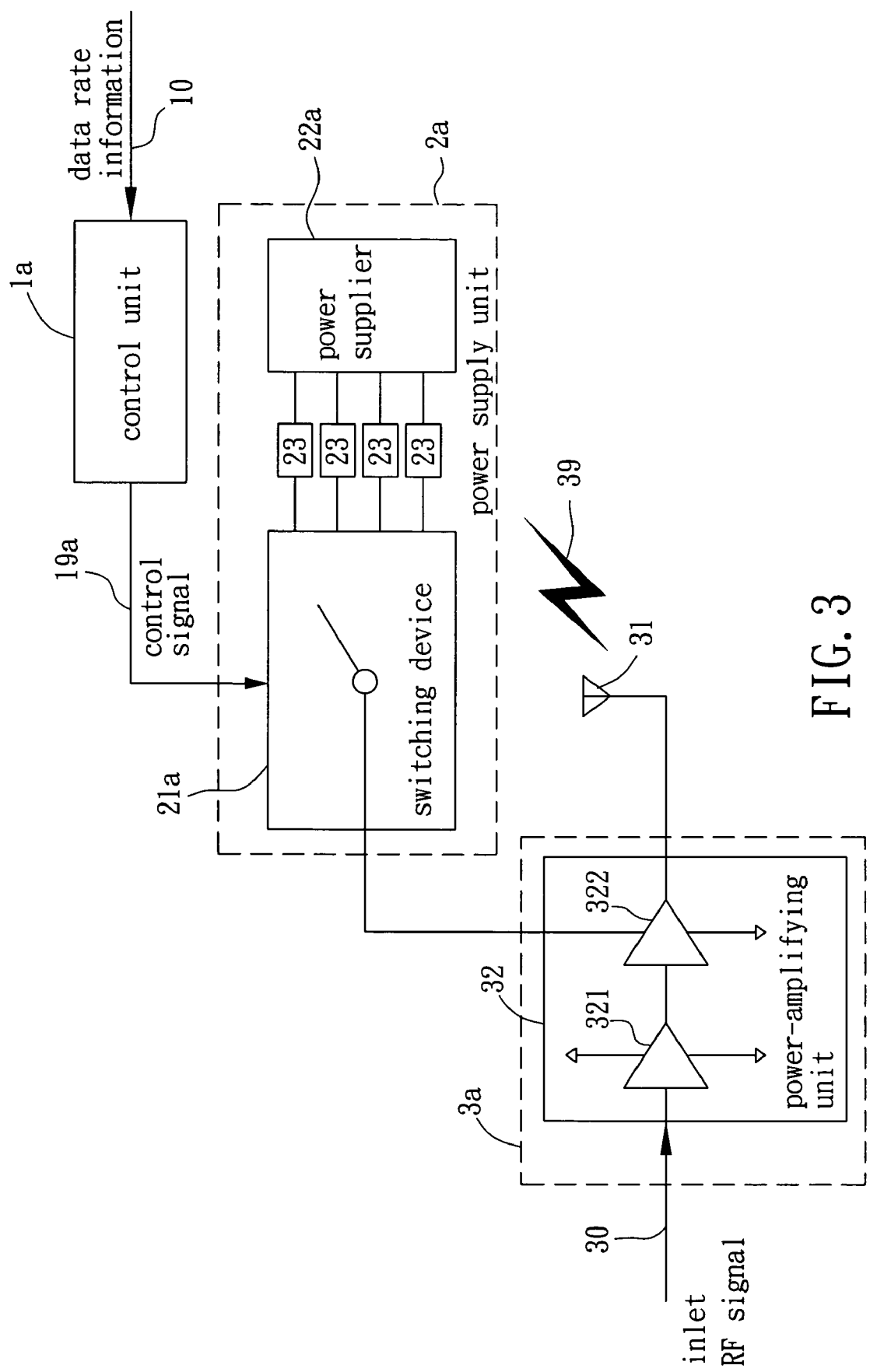
FIG. 3 is a block diagram showing another preferred embodiment of the system for RF power control according to the present invention.

FIG. 3 is a block diagram showing another preferred embodiment of the system for RF power control according to the present invention. As shown in FIG. 3, the system includes a control unit 1a, which can be built in a baseband processor/media access control (BBP/MAC) to assign the data rate information 10 to a group in terms of a rate range as described above. In still another embodiment, the control unit 1a can be separated from the BBP/MAC. In still another embodiment, the BBP/MAC can actively adjust the data rate according to the instant transmitting condition. In this embodiment, the power supply unit 2a, coupled to the control unit 1a, can provide four different power levels corresponding to four different rate ranges.

In the embodiment of FIG. 3, the transmitting unit 3a includes a transmitting device 31 and a power-amplifying unit 32. The transmitting device 31 can be an antenna or equivalents for transmitting RF signals. The power-amplifying unit 32 is for receiving and amplifying an inlet RF signal 30, which can come from a signal source, such as a driver amplifier or transmitter, and then outputs the RF signal 39 by the transmitting device 31. The power-amplifying unit 32 contains a front-end stage amplifier 321 and a back-end stage amplifier 322, where the bias voltage of the front-end stage amplifier 321 is provided with a fixed voltage from another power supplier, while the bias port of the back-end stage amplifier 322 is coupled to the power supply unit 2a, thereby changing its voltage gain or load driving capability. The power-amplifying unit 32 is thus enabled to amplify the inlet RF signal 30 and output the RF signal 39.

Figure 4:
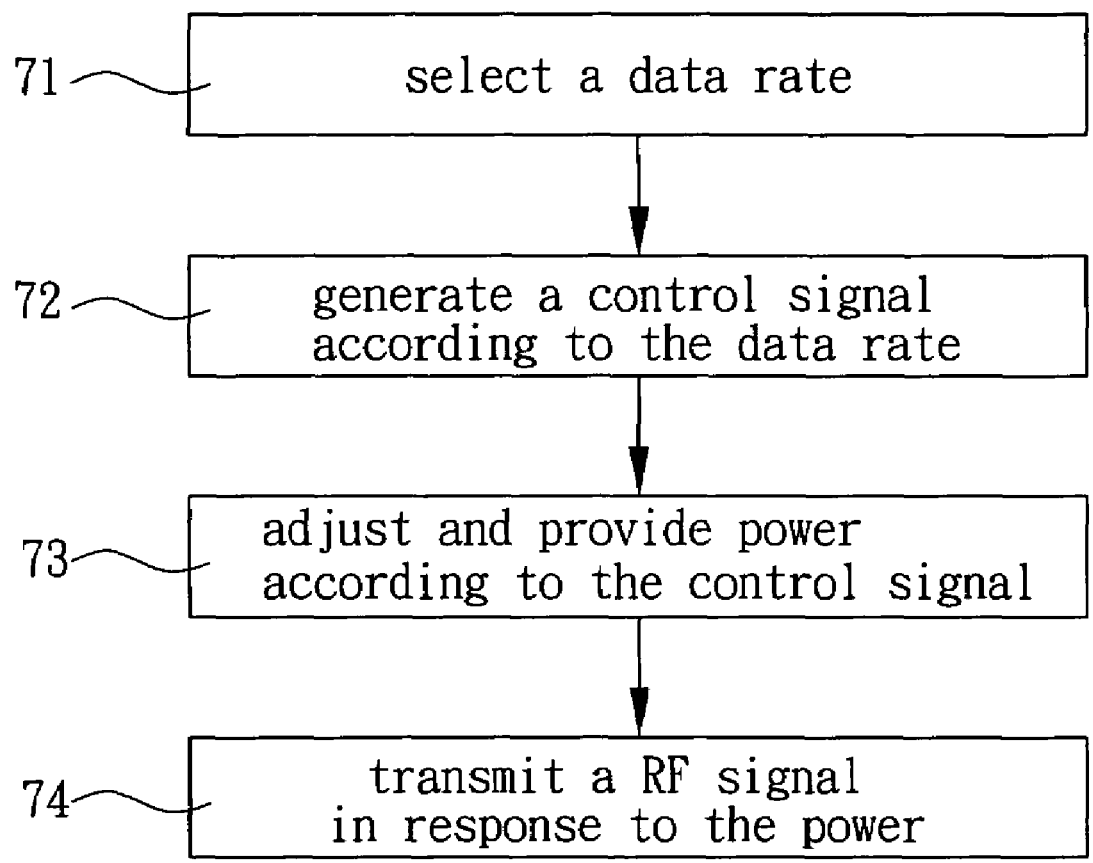
FIG. 4 is a flow chart showing a preferred embodiment of the method for RF power control according to the present invention.

FIG. 4 is a flow chart showing a preferred embodiment of the method for RF power control according to the present invention. As shown in FIG. 4, the flow chart comprises steps of:

71 selecting a proper data rate according to conditions of the instant communication environment, practical needs, allowable power gains of the amplifiers, etc.;

72 generating a control signal according to the selected data rate;

73 adjusting and providing power according to the control signal; and 74 transmitting a RF signal in response to the power.

In the step 72, the data rate is assigned to a group in terms of a rate range as described above. The grouping of the data rate can be configured before signal transmission, or flexibly modified during signal transmission. In the step 73, the control signal corresponding to a high/low data rate group can generate respectively a high/low power level.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. A system for radio frequency (RF) power control comprising:
   a control unit for generating a control signal according to a data rate;
   a transmitting unit for transmitting a RF signal; and
   a power supply unit, coupled to the control unit, for providing power to the transmitting unit according to the control signal, the power supply unit has a switching device for switching an output of the power according to the control signal,
   the transmitting unit has a power-amplifying unit for receiving the power and an inlet RF signal, and amplifying the inlet RF signal to output the RF signal.

2. The system of claim 1, wherein the RF signal is a wireless local area network (WLAN) signal.

3. The system of claim 1. wherein the control signal provides a data rate indicator far assigning the data rate to a predetermined rate range.

4. The system of claim 1, wherein the power supply unit further comprises: a voltage adjusting device for adjusting a voltage level of the power.

5. The system of claim 1, wherein the power supply unit further comprises: a current adjusting device for adjusting a current level of the power.

6. The system of claim 1, wherein the power supply unit at least provides a high power corresponding to a high data rate, mid a low power corresponding to a low data rate.

7. The system of claim 1, wherein the control unit is built in a baseband processor/media access control (BBP/MAC).

* * * * *